(12) United States Patent
Lou

(10) Patent No.: US 7,002,898 B1
(45) Date of Patent: Feb. 21, 2006

(54) ASYMMETRICAL TRANSPORT OF DATA

(75) Inventor: Heng Lou, Eagan, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 694 days.

(21) Appl. No.: 09/629,782

(22) Filed: Jul. 31, 2000

Related U.S. Application Data

(60) Continuation-in-part of application No. 09/397,374, filed on Sep. 16, 1999, now abandoned, which is a division of application No. 08/673,002, filed on Jun. 28, 1996, now Pat. No. 6,334,219, which is a continuation-in-part of application No. 08/650,408, filed on May 20, 1996, now abandoned.

(51) Int. Cl.
*H04J 9/00* (2006.01)
(52) U.S. Cl. .................. 370/204; 370/352; 375/353
(58) Field of Classification Search ............... 370/352, 370/353, 354, 355, 356, 400, 203, 204, 206, 370/208; 375/242, 298, 353, 354
See application file for complete search history.

(56) References Cited

U.S. PATENT DOCUMENTS

| | | |
|---|---|---|
| 3,700,820 A | 10/1972 | Blasbalg et al. |
| 4,191,860 A | 3/1980 | Weber |
| 4,215,366 A | 7/1980 | Davidson |
| 4,488,004 A | 12/1984 | Bogart et al. |
| 4,868,811 A | 9/1989 | Suzuki |
| 5,029,164 A | 7/1991 | Goldstein et al. |
| 5,124,980 A | 6/1992 | Maki |
| 5,195,092 A | 3/1993 | Wilson et al. |
| 5,197,061 A | 3/1993 | Halbert-Lassalle et al. |
| 5,235,619 A | 8/1993 | Beyers, II et al. |
| 5,347,304 A | 9/1994 | Moura et al. |
| 5,355,114 A | 10/1994 | Sutterlin et al. |
| 5,479,447 A | 12/1995 | Chow et al. |
| 5,586,121 A | 12/1996 | Moura et al. |
| 5,784,683 A * | 7/1998 | Sistanizadeh et al. ......... 725/73 |
| 5,787,483 A * | 7/1998 | Jam et al. .................... 711/158 |
| 5,828,660 A * | 10/1998 | Baum et al. ................. 370/330 |
| 5,946,322 A | 8/1999 | Moura et al. |
| 5,963,557 A * | 10/1999 | Eng ........................... 370/432 |
| 6,005,861 A * | 12/1999 | Humpleman ................. 370/352 |

(Continued)

FOREIGN PATENT DOCUMENTS

EP   080782   6/1983

(Continued)

OTHER PUBLICATIONS

Goldberg, L., "Brains and Bandwidth: Fiber Service at Copper Prices", Electronic Design, 43, pp. 51-60, Oct. 2, 1995.

*Primary Examiner*—Ajit Patel
*Assistant Examiner*—Chirag Shah
(74) *Attorney, Agent, or Firm*—Fogg and Associates, LLC; David N. Fogg

(57) ABSTRACT

A system is described which provides bidirectional transport of data at different data rates for each direction over a shared medium. In one embodiment, the different data rates are accomplished using different modulation techniques. For example, in the downstream direction, quadrature amplitude modulation (QAM) 64 is used and in the upstream direction orthogonal frequency division multiplexing (OFDM) is used. The QAM 64 modulation provides for a higher number of bits per hertz in a transmission channel. By using QAM 64 modulation, down stream transmission rates on the order of 30 megabits per second (Mbps) in a 6 MHz channel can be achieved. A number of 6 MHz channels can be combined to provide for even higher data rates.

24 Claims, 2 Drawing Sheets

U.S. PATENT DOCUMENTS

| | | | |
|---|---|---|---|
| 6,011,950 A * | 1/2000 | Young | 725/67 |
| 6,041,056 A | 3/2000 | Bigham et al. | |
| 6,055,242 A * | 4/2000 | Doshi et al. | 370/458 |
| 6,091,932 A * | 7/2000 | Langlais | 725/111 |
| 6,279,158 B1 | 8/2001 | Geile et al. | |
| 6,292,651 B1 | 9/2001 | Dapper et al. | |
| 6,334,219 B1 | 12/2001 | Hill et al. | |
| 6,366,585 B1 | 4/2002 | Dapper et al. | |
| 6,418,558 B1 | 7/2002 | Roberts et al. | |
| 6,477,354 B1 | 11/2002 | Roberts et al. | |
| 6,487,405 B1 | 11/2002 | Dapper | |
| 6,535,715 B1 | 3/2003 | Dapper et al. | |
| 6,577,642 B1 * | 6/2003 | Fijolek et al. | 370/465 |
| 6,594,322 B1 | 7/2003 | Dapper et al. | |
| 6,606,351 B1 | 8/2003 | Dapper et al. | |
| 6,662,367 B1 | 12/2003 | Dapper et al. | |
| 2001/0032334 A1 * | 10/2001 | Dapper et al. | 725/105 |

FOREIGN PATENT DOCUMENTS

| | | |
|---|---|---|
| EP | 0578313 A1 | 1/1994 |
| EP | 0584820 A1 | 3/1994 |
| WO | WO95/34168 | 12/1995 |
| WO | WO96/10303 | 4/1996 |

* cited by examiner

US 7,002,898 B1

ASYMMETRICAL TRANSPORT OF DATA

CROSS REFERENCE

This application is a continuation-in-part of U.S. application Ser. No. 09/397,374, filed Sep. 16, 1999 (abandoned), which is a divisional of U.S. application Ser. No. 08/673,002, filed Jun. 28, 1996 (now U.S. Pat. No. 6,334,219), which is a continuation-in-part of U.S. application Ser. No. 08/650,408 filed May 20, 1996 (abandoned).

TECHNICAL FIELD

The present invention relates generally to the field of telecommunications and, in particular, to a system for the asymmetrical transport of data.

BACKGROUND

Telecommunications networks were developed to carry narrow bandwidth (low speed) voice communications between users at geographically dispersed locations. More recently, these networks have been used to transport data as well as voice communications. Conventionally, computers use modems to transmit data over a telecommunications network. Typically, these modems can transmit data with a rate up to approximately 56 kilobits per second (kbps) although modems with higher rates are available.

Telecommunications services are in high demand. And the demand continues to grow. Businesses, educational institutions, and individuals all have communications needs. These needs are met by an ever-widening field of service providers. For example, many cable companies have begun to offer telecommunications services, e.g., telephony, and data transmission, over their existing cable plant.

One problem with the transmission of data over existing telecommunications networks is the speed at which data is transmitted over the network. For example, some conventional modems can take up to an hour or more to download large files from the Internet.

For the reasons stated above, and for other reasons stated below which will become apparent to those skilled in the art upon reading and understanding the present specification, there is a need in the art for a system for transporting data at high data rates.

SUMMARY

The above mentioned problems with telecommunications systems and other problems are addressed by the present invention and will be understood by reading and studying the following specification. A system is described which provides bidirectional transport of data at different data rates for each direction over a shared medium. In one embodiment, the different data rates are accomplished using different modulation techniques. For example, in the downstream direction, quadrature amplitude modulation (QAM) 64 is used and in the upstream direction orthogonal frequency division multiplexing (OFDM) is used. The QAM 64 modulation provides for a higher number of bits per hertz in a transmission channel. By using QAM 64 modulation, down stream transmission rates on the order of 30 Megabits per second (Mbps) in a 6 MHZ channel can be achieved. A number of 6 MHZ channels can be combined to provide for even higher data rates.

DETAILED DESCRIPTION

The following detailed description refers to the accompanying drawings which form a part of the specification. The drawings show, and the detailed description describes, by way of illustration specific illustrative embodiments in which the invention may be practiced. These embodiments are described in sufficient detail to enable those skilled in the art to practice the invention. Other embodiments may be used and logical, mechanical and electrical changes may be made without departing from the scope of the present invention. The following detailed description is, therefore, not to be taken in a limiting sense.

Figure 1:
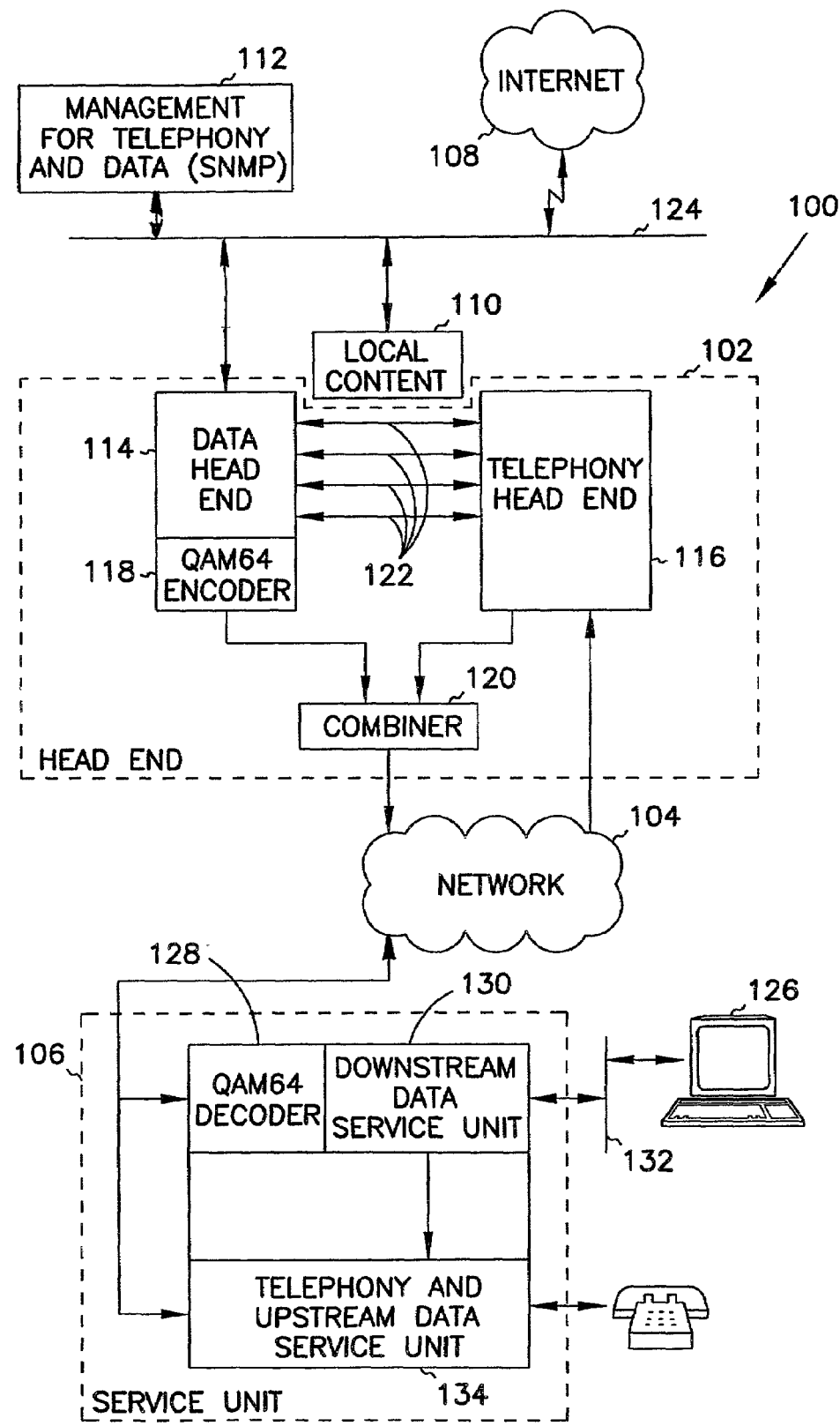
FIG. 1 is a block diagram of one embodiment of a system for the asymmetrical communication of data according to the teachings of the present invention.

FIG. 1 is a block diagram of one embodiment of a system, indicated generally at 100, for the asymmetrical communication of data according to the teachings of the present invention. System 100 includes head end 102 and at least one service unit 106. For clarity in the Figures and description, system 100 is described in terms of a single service unit 106. However, one of skill in the art will readily understand that system 100 can include any appropriate number of service units.

Head end 102 communicates with service unit 106 over network 104. Network 104 comprises, for example, a hybrid fiber/coax network or other appropriate network that is capable of bidirectional communication between head end 102 and service unit Communication in system 100 is asymmetrical. Head end 102 transmits to service unit 106 over network 104 ("downstream transmission"). Further, service unit 106 also transmits to head end 102 ("upstream transmission") over the same network 104. This communication is asymmetrical because the downstream and upstream transmissions are accomplished with different data rates. For example, the data rate for downstream transmissions can be much higher than the data rates of the upstream transmissions. Advantageously, system 100 can more efficiently download large data files to a remote user, e.g., download large files from the Internet. A request for data is typically larger than the data requested. The request is thus easily transmitted from a user through service unit 106 to head end 102 over a low data rate connection without a large time delay. Then, head end 102 transmits the typically larger volume of data to the user at service unit 106 in a relatively short period of time due to the higher data rate in the downstream transmission. This arrangement more effectively uses the bandwidth resources of the network.

In one embodiment, head end 102 includes data head end 114 and telephony head end 116. Data head end 114 includes quadrature amplitude modulation (QAM) 64 encoder 118 that modulates data for downstream transmission over network 104. The use of QAM 64 encoding allows data to be transmitted at a rate of 30 Mbps in a 6 MHZ channel. Data head end 114 has access to a number of channels in network 104. For example, data head end 114 may transmit on up to 28 of the 6 MHZ channels of network 104 in the downstream direction providing a maximum data capacity in this example of 840 Mbps.

Telephony head end 116 transmits telephony signals on, for example, three of the 6 MHZ channels of network 104 in the downstream direction such as described in co-pending application Ser. No. 08/673,002 (the '002 application), which application is incorporated herein by reference. The downstream outputs of QAM 64 encoder 118 and telephony head end 116 are combined in combiner 120 and transmitted over network 104 to service unit 106.

Data head end 114 includes an interface for connection to a data source. For example, the interface may comprise a 100 BaseT or 10 BaseT Ethernet interface for connecting to a local area network or switched Ethernet network 124. Further, this interface can provide a connection to the Internet 108, local content 110, management for telephony and data (SNMP) 112, or other appropriate source of data.

Upstream data transmission is handled by telephony head end 116. Telephony head end 116 is coupled to data head end over one or more communications links 122, e.g., a T1 or E1 communications link. Thus, when upstream data is received at telephony head end, the data is switched over the communications link 122 to data head end 114.

Service unit 106 includes QAM 64 decoder 128 that receives data transmissions from network 104. Decoder 128 is coupled to downstream data service unit ("data service unit") 130. Data service unit 130 is coupled to, for example, terminal 126 over local area network 132. Service unit 106 further includes telephony and upstream data service unit ("telephony service unit") 134 that communicates both the telephony data and upstream data to head end 102.

In operation, system 100 communicates data between a data source and a user. For example, a user requests data from Internet 108 using terminal 126. The request is processed through service unit 106. Data service unit 130 receives the request and passes it to telephony service unit 134. The request is then passed to head end 102 in a frequency band designated for upstream transmission, e.g., 18 to 40 MHZ. The request is modulated using, for example, orthogonal frequency division multiplexing modulation as described in the '002 application.

The request is received by telephony head end 116 and passed to data head end 114 over communications link 122. Data head end 114 receives the data from Internet 108 and provides the data to QAM 64 encoder 118. This data is modulated such that the data rate is as much as 30 Mbps in a 6 MHZ channel. This data is transmitted in a different frequency band from the upstream transmissions.

Service unit 106 receives the data at QAM 64 decoder 128. This data is provided to terminal 126 over network 132 by data service unit 130.

Figure 2:
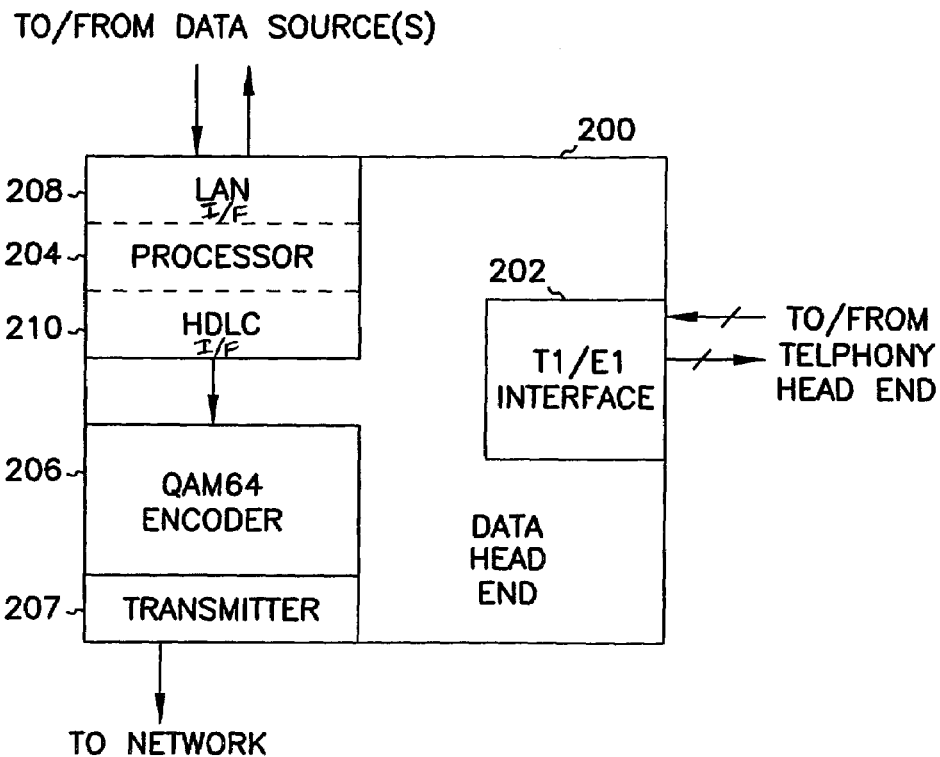
FIG. 2 is a block diagram of an embodiment of a data head end for the asymmetrical communication of data over a network.

FIG. 2 is a block diagram of an embodiment of a data head end, indicated generally at 200, for the asymmetrical communication of data over a network. Data head end 200 interfaces with data sources, a telephony head end, and a network.

Data head end 200 includes a T1/E1 interface 202 for communicating with the telephony head end. In one embodiment, interface 202 provides an interface for a number of T1 or E1 lines, e.g., up to 4 lines. The number of lines coupled to data head end 200 depends on the number of users serviced by data head end 200. If a small number of users is associated with the bandwidth of data head end 200, then one T1 or E1 line may be sufficient. However, if the bandwidth of data head end 200 is to be shared by a large number of users, then more T1 or E1 lines may be necessary to communicate upstream information from the users to data head end 200. An appropriate T1/E1 interface is commercially available from LSI Logic or Motorola.

Data head end 200 also includes processor 204 and QAM 64 encoder 206. Processor 204 provides interfaces to data sources through LAN interface (I/F) 208. Further, processor 204 includes a high level data link control (HDLC) interface 210 that provides data to QAM 64 encoder 206. QAM 64 encoder 206 comprises, for example, encoder part number L64767 from LSI Logic. An appropriate processor for data head end 200 is also available from LSI Logic.

Encoder 206 is coupled to transmitter 207 to transmit data over a network. This transmission is downstream transmission at high data rates, e.g., up to 30 Mbps in a 6 MHZ channel. Interface 202 receives upstream transmissions for data head end 200. These transmissions are pulled off the incoming channels of the communications link and provided to processor 204. Processor 204 then communicates with a data source through LAN interface 208.

Figure 3:
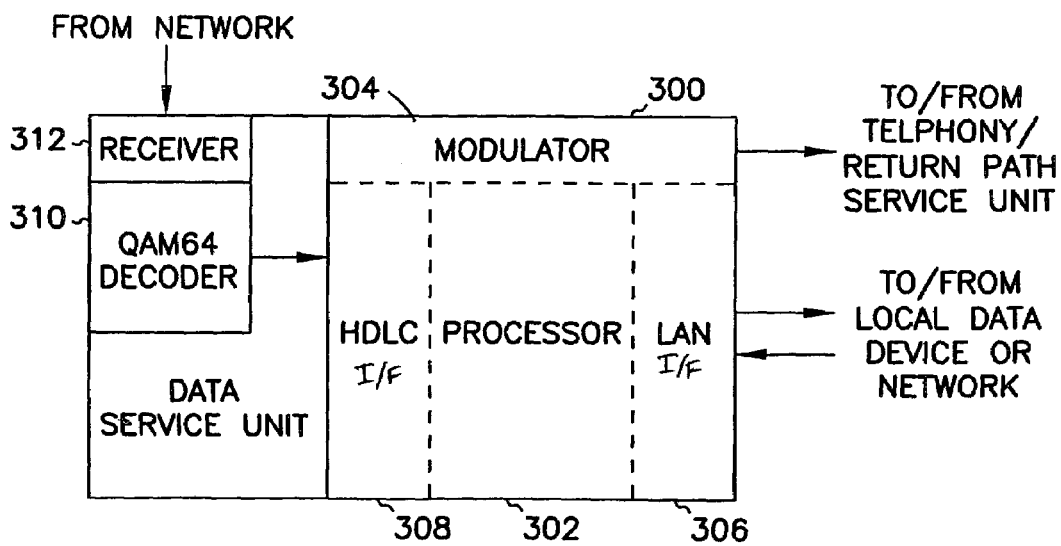
FIG. 3 is a block diagram of an embodiment of a data portion of a service unit for the asymmetrical communication of data over a network.

FIG. 3 is a block diagram of an embodiment of a data service unit, indicated generally at 300, for the asymmetrical communication of data over a network. Data service unit 300 interfaces with a telephony service unit, a local data device or network, and the transport network. Data service unit 300 receives downstream data at a first data rate at receiver 312 and quadrature amplitude modulation (QAM) 64 decoder 310. In one embodiment, QAM 64 decoder 310 comprises decoder part number L64768 from LSI Logic. Data head end 300 further transmits data with modulator 304 at a different, lower data rate in the upstream direction. Both downstream and upstream transmissions are accomplished over the same medium.

Data service unit 300 includes processor 302. Processor 302 includes a LAN interface 306 that interfaces with a local data device or network, e.g., a computer. LAN interface 306 thus receives upstream data from and provides downstream data to a local device or network. Processor 302 also includes an interface 308 that receives high level data link control (HDLC) data from QAM 64 encoder 310. Finally, processor 302 includes a modulator 304 that interfaces with a telephony/return data path service unit. The modulator 304 passes the upstream data out from data service unit 300 at a lower data rate compared to the data rate of the downstream transmissions.

In operation, data service unit 300 provides for asymmetrical transport of data over a network. Downstream data is received at receiver 312. Receiver 312 provides the data to QAM 64 decoder 310 for demodulation. This data is presented to processor 302 at HDLC interface 308. Processor 302 further provides the data to a local device or network through LAN interface 306.

In the upstream, data is transmitted at a lower data rate. The upstream data is received at LAN interface 306. Modulator 304 of processor 302 then provides this upstream data for transmission over the network in the same channel that is used to carry the return path for telephony signals over the network.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the network 104 of FIG. 1 is not limited to a hybrid fiber/coax network. Other appropriate network configurations can also be used that provide for bidirectional transport of data. Further, other modulation techniques can be used so long as asymmetrical data rates are used to transport the data in upstream and downstream directions over a common network.

What is claimed is:

1. A system for the asymmetrical transport of data over a network, the system comprising:
   a data head end that is communicatively coupled to the network and to at least one data source;
   at least one service unit coupled to the network;
   an encoder that couples the data head end to the network, wherein the encoder modulates data from the at least one data source using a first modulation technique and transmits downstream the modulated data over the network in a first frequency band to selected service units, wherein the encoder is a quadrature amplitude modulation (QAM) encoder; and
   each service unit including a decoder for demodulating data from the downstream transmission and a modulator that modulates data using orthogonal frequency division multiplexing (OFDM) for transmission upstream to the data head end over the same network in a second frequency band, such that the data rate of the downstream transmission is different from the data rate of the upstream transmission.

2. The system of claim 1, wherein the encoder is a quadrature amplitude modulation (QAM) 64 encoder.

3. The system of claim 1, wherein the data head end includes a full duplex 100 BaseT Ethernet connection to a switched Ethernet network.

4. The system of claim 1, wherein the data head end is coupled to the Internet.

5. The system of claim 1, and further comprising a telephony head end, coupled to the data head end and to the network, that transmits telephony data over the same network at a data rate different from the downstream transmission and that receives the upstream transmission for the data head end.

6. The system of claim 5, wherein the telephony head end includes a communication link with the data head end.

7. The system of claim 6, wherein the communication link includes at least one T1 or E1 communication link.

8. The system of claim 1, wherein the network is a hybrid fiber/coax network.

9. The system of claim 1, wherein the data rate of the downstream transmission is greater than the data rate of the upstream transmission.

10. A head end for an asymmetrical data transport network, the head end comprising:
    a data head end having at least one interface for connection to a data source;
    an encoder, communicatively coupled with the data source through the at least one interface of the data head end, wherein the encoder modulates data from the at least one data source using a first modulation technique and transmits downstream the modulated data over the network in a first frequency band to selected service units, wherein the encoder is a quadrature amplitude modulation (QAM) encoder; and
    a telephony head end that receives data from service units for the data head end, wherein the data from the service units is modulated using orthogonal frequency division multiplexing (OFDM) for transmission upstream over the same network in a second frequency band, such that the data rate of the downstream transmission is different from the data rate of the upstream transmission.

11. The head end of claim 10, wherein the encoder is a quadrature amplitude modulation (QAM) 64 encoder.

12. The head end of claim 10, wherein the at least one interface of the data head end includes a full duplex 100 BaseT Ethernet connection to a switched Ethernet network.

13. The head end of claim 10, wherein the data head end is coupled to the Internet.

14. The head end of claim 10, and further comprising a communication link between the telephony head end and the data head end.

15. The head end of claim 14, wherein the communication link includes at least one T1 or E1 communication link.

16. The head end of claim 10, wherein the network is a hybrid fiber/coax network.

17. The head end of claim 1, wherein the data rate of the downstream transmission is greater than the data rate of the upstream transmission.

18. A method for transporting data over a network, the method comprising:
    receiving downstream direction data at a head end from a data source;
    modulating the downstream direction data from the data source with a quadrature amplitude modulation (QAM) modulation technique that produces a downstream transmission with a first data rate;
    transmitting the downstream transmission over a network to a service unit;
    receiving the downstream transmission at the service unit;
    modulating data from the service unit with a modulation technique that produces an orthogonal frequency division multiplexing (OFDM) upstream transmission with a second data rate;
    transmitting the upstream transmission over the network to the head end; and
    receiving the upstream transmission from the service unit with a second, different data rate over the same network.

19. The method of claim 18, wherein modulating the downstream direction data comprises modulating the downstream direction data with a quadrature amplitude modulation (QAM) 64 modulation.

20. The method of claim 18, wherein receiving downstream direction data from a data source comprises receiving data from the Internet.

21. The method of claim 18, wherein modulating the downstream direction data comprises modulating the downstream direction data for transmission in at least one 6 MHz channel using quadrature amplitude modulation.

22. A service unit for asymmetrical transport of data over a network, the service unit comprising:
    a decoder that receives downstream data in a first frequency band over the network with a first data rate wherein, the decoder is a quadrature amplitude modulation (QAM) decoder; and
    a modulator, coupled to the same network, that provides upstream data over the network in a second, different frequency band with a second, different data rate using orthogonal frequency division multiplexing (OFDM).

23. The service unit of claim 22, wherein the decoder comprises a quadrature amplitude modulation (QAM) 64 decoder.

24. The service unit of claim 22, wherein the modulator provides upstream data with a data rate that is less than the data rate of the downstream data.

* * * * *